United States Patent
Smithers

(10) Patent No.: US 8,761,415 B2
(45) Date of Patent: *Jun. 24, 2014

(54) CONTROLLING THE LOUDNESS OF AN AUDIO SIGNAL IN RESPONSE TO SPECTRAL LOCALIZATION

(75) Inventor: Michael Smithers, Kareela (AU)

(73) Assignee: Dolby Laboratories Corporation, San Francisco, CA (US)

( * ) Notice: Subject to any disclaimer, the term of this patent is extended or adjusted under 35 U.S.C. 154(b) by 211 days.

This patent is subject to a terminal disclaimer.

(21) Appl. No.: 13/265,691

(22) PCT Filed: Apr. 28, 2010

(86) PCT No.: PCT/US2010/032807
§ 371 (c)(1),
(2), (4) Date: Oct. 21, 2011

(87) PCT Pub. No.: WO2010/127024
PCT Pub. Date: Nov. 4, 2010

(65) Prior Publication Data
US 2012/0039490 A1    Feb. 16, 2012

Related U.S. Application Data

(60) Provisional application No. 61/174,468, filed on Apr. 30, 2009.

(51) Int. Cl.
*H03G 3/00* (2006.01)
*H03G 5/00* (2006.01)

(52) U.S. Cl.
USPC ............................................. 381/107; 381/98

(58) Field of Classification Search
USPC ................... 381/104, 107, 100; 704/224, 233
See application file for complete search history.

(56) References Cited

U.S. PATENT DOCUMENTS

| 5,878,391 | A | 3/1999 | Aarts |
| 7,454,331 | B2 | 11/2008 | Vinton |
| 8,019,095 | B2 | 9/2011 | Seefeldt |
| 2007/0092089 | A1 | 4/2007 | Seefeldt |
| 2007/0291959 | A1 | 12/2007 | Seefeldt |
| 2009/0220109 | A1 | 9/2009 | Crockett |
| 2009/0290727 | A1 | 11/2009 | Seefeldt |
| 2010/0174540 | A1 | 7/2010 | Seefeldt |
| 2010/0198377 | A1 | 8/2010 | Seefeldt |
| 2011/0009987 | A1 | 1/2011 | Gundry |

FOREIGN PATENT DOCUMENTS

| WO | 2008/156774 | 12/2008 |
| WO | 2010/129395 | 11/2010 |

OTHER PUBLICATIONS

Seefeldt, et al., "A New Objective Measure of Perceived Loudness" AES Convention Paper 6236, presented at the 117th Convention, Oct. 28-31, 2004, San Francisco, USA.

*Primary Examiner* — Xu Mei
*Assistant Examiner* — Ammar Hamid

(57) ABSTRACT

The invention relates to modifying the loudness of an audio signal by measuring the weighted broadband level of the audio signal and modifying that weighted broadband level as a function of a spectral localization estimate of the audio signal.

13 Claims, 2 Drawing Sheets

CONTROLLING THE LOUDNESS OF AN AUDIO SIGNAL IN RESPONSE TO SPECTRAL LOCALIZATION

CROSS-REFERENCE TO RELATED APPLICATIONS

This application claims priority to U.S. Provisional Patent Application No. 61/174,468, filed 30 Apr. 2009, hereby incorporated by reference in its entirety.

FIELD OF THE INVENTION

This invention relates to audio signal processing. In particular, the invention relates to modifying the loudness of an audio signal by measuring the weighted broadband level of the audio signal and modifying that weighted broadband level as a function of a spectral localization estimate of the audio signal.

SUMMARY OF THE INVENTION

According to aspects of the present invention, a method for controlling the loudness of an audio signal comprises receiving an audio signal, generating an estimate of the spectral localization of the audio signal, generating a broadband measure of loudness of the audio signal, modifying said broadband measure of loudness in response to an estimate of the spectral localization of the audio signal, and modifying the broadband level of the audio signal in response to the modified broadband measure of loudness. Generating an estimate of the spectral localization of the audio signal may include determining the degree to which a majority of the audio signal's energy is within half of the signal's total audio bandwidth when a perceptual frequency banding scale is employed, which may, in turn, include dividing the audio signal into a plurality of frequency bands and generating a scaling factor in response to the relative level in two frequency bands. The modified broadband measure of loudness may be temporally smoothed and the broadband level of the audio signal may be modified in response to the smoothed modified broadband measure of loudness. The temporal smoothing may have one or more time constants useful for syllabic speech processing. The two frequency bands may be the bands having the second largest and largest level power values. The two frequency bands may be the two lowest frequency bands. Generating a broadband measure of loudness of the audio signal may determine the broadband measure of loudness of the audio signal after its processing by a weighting filter. The broadband measure of loudness and the level in two or more of the frequency bands may each be based on short-term levels.

Although in principle the invention may be practiced either in the analog or digital domain (or some combination of the two), in practical embodiments of the invention, audio signals are represented by samples in blocks of data and processing is done in the digital domain.

In FIGS. 1 and 2, essentially identical devices and functions bear the same reference numeral when they appear in multiple figures. Modified devices and functions are distinguished by a prime (') or double prime (") symbol.

FIG. 1 is a functional schematic block diagram of an arrangement for controlling the loudness of an audio signal according to aspects of the present invention. The arrangement receives the audio signal and applies it to two paths: a control path and a signal path. In the control path, the loudness of the audio signal is measured in a Measure Loudness device or function 2. The resulting measure of loudness is applied to a Modify Loudness device or function 4 that uses the measure of loudness and one or more "Loudness Modification Parameters" to create a gain value that when multiplied with the original audio signal, as in multiplier 8, produces a modified audio signal having a desired modified loudness. The audio signal in the signal path may be delayed by a delay 6 to match latency incurred in Measure Loudness 2 and Modify Loudness 4. Although the arrangement may operate uninterruptedly, intermittently, or just once for a finite length audio signal, for the examples described herein, the audio signal may be processed intermittently in consecutive time interval blocks of approximately 5 to 20 milliseconds—however, such a block length is not critical to the invention.

Modify Loudness 4 includes a loudness versus gain characteristic that outputs a gain value in response to the input loudness measure and one or more loudness modification parameters. The Loudness Modification Parameters may select and/or modify the loudness-versus-gain characteristic. The resulting gain value may, for example, impose a dynamic range modification on the audio signal by, for example, applying compression and/or expansion as the loudness measure changes dynamically.

Measure Loudness 2 employs a weighted-level-based loudness measurement. The audio signal is passed through a weighting filter 10, for example an A-, B-, or C-weighting filter, that emphasizes more perceptually relevant audio frequencies and de-emphasizes less perceptually relevant frequencies. At each time interval (a block, in this example), the broadband level (typically, broadband power) of the audio signal is calculated in Level Calculation device or function 12 and, optionally, temporally smoothed in Smoothing device or function 14 to produce a time-smoothed broadband power measurement, which is a measure of loudness. By "broadband" is meant the entire frequency band or spectrum of the audio signal (full bandwidth audio) or substantially the entire frequency band (in practical implementations, band limiting filtering at the ends of the spectrum is often employed). If the goal is to modify the loudness of the audio signal over time, smoothing in Smoothing 14 may be performed with time constants commensurate with perceptual temporal smoothing of loudness. For example, a temporal smoothing having an attack time of 15 ms and a release time of 50 ms may be employed. However, those time constants are not critical to the invention and other values may be used.

The inventor has determined that weighted level (typically, power) measurements such as performed by Weighting Filter 10 and Level Calculation 12, as described below, significantly overrate spectrally localized signals. In other words, when a short-term (a time commensurate with the block time interval, 5 to 20 ms, in the above example) loudness measurement based on weighted level is calibrated to match subjective loudness estimates for average and spectrally complex audio signals, spectrally localized signals are measured as being significantly louder than corresponding subjective loudness estimates and are treated disproportionately to other signals. For example, in the case of loudness-based dynamics processing, the result may be that more gain change is applied to spectrally localized signals than is necessary.

Still referring to the example of FIG. 1, in parallel to the weighted broadband level measurement performed in Weighting Filter 10 and Level Calculation 12, the audio signal is applied to a Filterbank device or function 16 that splits the audio signal into a multiplicity of frequency bands. A Spectral Localization device or function 18 determines how spectrally localized the audio signal is and calculates a loudness-reducing scale factor. The scale factor is multiplied by the broadband signal level estimate in order to lower the loudness estimate as the audio signal becomes more and more spectrally localized. The resulting lowered broadband level estimate is optionally smoothed in Smoothing 14 as described above. The optionally smoothed broadband level estimate, which is a measure of loudness, is applied to Modify Loudness 4 that produces a gain value for use in producing the loudness-adjusted modified audio signal.

By "spectral localization" is meant a measure of narrowbandedness of the signal component distribution in the bandwidth of an audio signal undergoing processing. For the purposes of this invention, a signal may be considered narrowbanded or spectrally localized when the majority of its energy is within half of the human auditory bandwidth of 20 Hz to 20 kHz when a perceptual frequency banding scale such as ERB or critical band (Bark) scaling is employed. In an example of a practical embodiment found to be useful, the human auditory bandwidth may be divided into five bands, as shown in FIG. 4, and the audio signal considered to be narrowbanded or spectrally localized when a majority of the signal's energy is in one of the bands, which would be less than half of the signal's total audio bandwidth on a Bark scale. It is not critical to the invention to determine narrowbandedness or spectral localization in the manner of the example. Other ways of determining narrowbandedness or spectral localization may be usable.

FIG. 2 is a functional schematic block diagram showing an example of a variation of the arrangement of FIG. 1 in which Measure Loudness 2' differs from Measure Loudness 2 of FIG. 1. In this FIG. 2 example, the weighted audio signal rather than the unweighted audio signal provides the input to Filterbank 16. This alternative arrangement has a few benefits. First, the Weighting Filter 10 acts as a DC blocking filter, reducing the effects of DC signals interfering with the Filterbank 16 and Spectral Localization 18 calculations. Second, it provides a more perceptually relevant audio signal to the Filterbank 16 and Spectral Localization 18, which leads to a final scaling factor that has been found to work better when the loudness of the audio signal is subsequently modified by the gain value in multiplier 8.

DETAILED DESCRIPTION OF THE INVENTION

Figure 1:
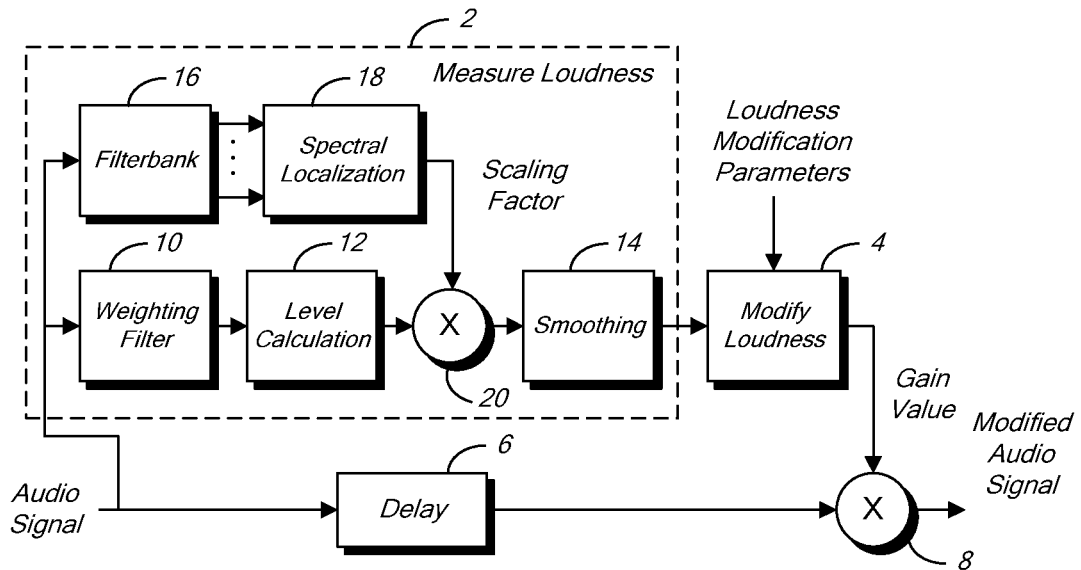
FIG. 1 is a functional schematic block diagram of an arrangement for controlling the loudness of an audio signal in accordance with aspects of the present invention.
Figure 2:
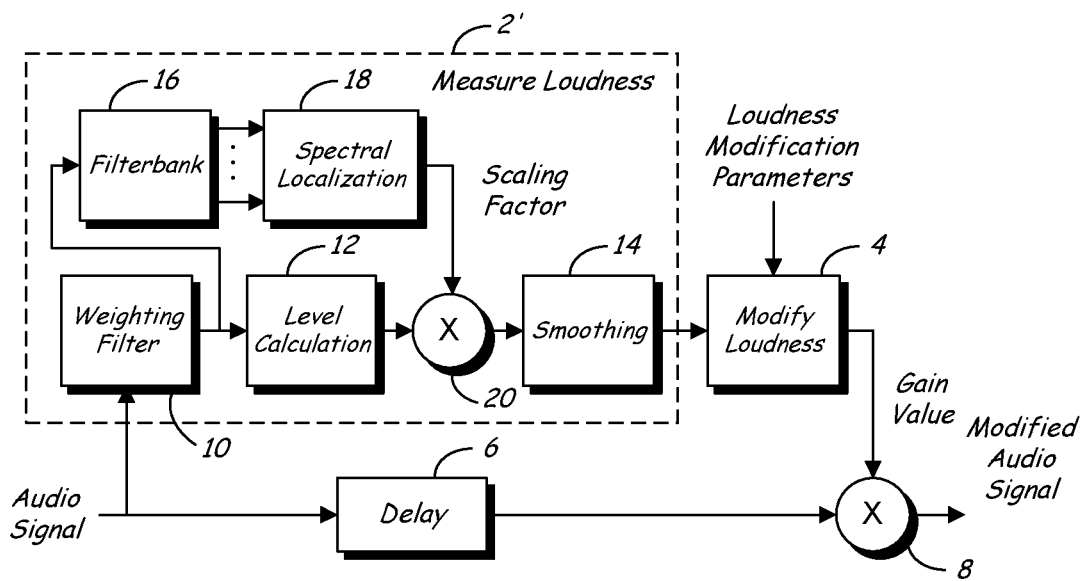
FIG. 2 is a functional schematic block diagram showing an example of a variation of the example of FIG. 2 in which Measure Loudness 2' differs from Measure Loudness 2 of FIG. 1.
Figure 3:
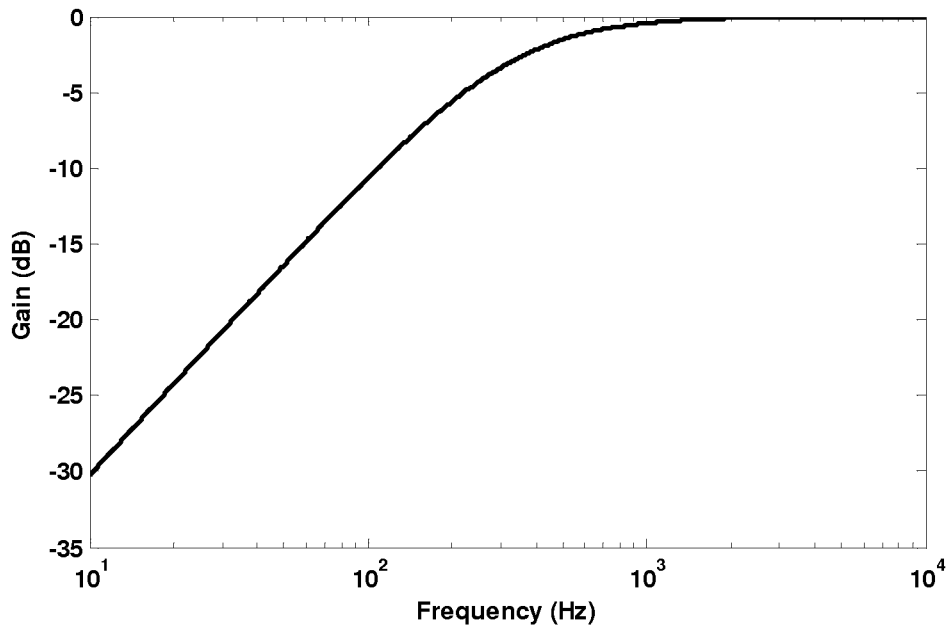
FIG. 3 is an idealized response characteristic (gain versus frequency) of a weighting filter that is suitable for use in the arrangements of FIGS. 1 and 2.

Referring to the example of FIG. 1, the audio signal is filtered by a weighting filter 10 whose frequency response may, for example, be as shown in the idealized response of FIG. 3. The filter may have a first order highpass characteristic with a corner frequency at 300 Hz and a low frequency characteristic similar to other common A, B & C weighting filters used in weighted power measures. The filter action may be represented as $$x'(n) = H[x(n)], \quad (1)$$

where the weighting filter input is x(n), the weighting filter output is x'(n) and the filter's transfer function is H. Although this weighting filter characteristic has been found to be useful, it is not critical to the invention and other weighting filter characteristics may be employed.

Level Calculation 12 then computes the average sample (n) power over a block of N samples, where k is the block index. The Level Calculation may be represented as $$P(k) = \frac{1}{N} \sum_{n=0}^{N-1} x'(n)^2. \quad (2)$$

As explained further below, the Filterbank computes spectral band power values using the autocorrelation of the audio samples in the block k. More specifically, a sliding overlapping block of N+Q samples of the audio signal may be constructed, where Q samples overlap with the adjacent blocks, and are windowed by window function. The window function may be unity in the center and taper down toward zero at its edges to reduce edge related errors in the autocorrelation. A useful value for the overlap length Q may be 31 samples at 48 kHz, although this is not critical to the invention and other overlap lengths and sampling rates may be employed. The autocorrelation of the k windowed sample block may then be computed. This may be represented as $$A(k, l) = \frac{1}{N} \sum_{n=0+1}^{N+Q-1} w(n) \cdot x(n) \cdot w(n-1) \cdot x(n-1) \quad (3)$$

for $l = 0, \ldots, 5,$ where w(n) are windowed samples and where l is the autocorrelation lag index.

The autocorrelation values A(k,l) may be transformed into band power values B using a matrix M, where b is the band index. Values for a sample rate of 48 kHz are suitable and may be rounded to 5 decimal places.

$$M = \begin{bmatrix} 0.01051 & 0.01889 & 0.01447 & 0.00920 & 0.00454 & 0.00143 \\ 0.01640 & 0.01262 & -0.0111 & -0.01636 & -0.00528 & 0.00374 \\ 0.02058 & 0.01052 & -0.02625 & -0.01667 & 0.00566 & 0.00616 \\ 0.02870 & -0.0096 & -0.03827 & 0.01435 & 0.00957 & -0.00478 \\ 0.03576 & -0.0358 & -0.02043 & 0.03320 & -0.01532 & 0.00255 \end{bmatrix} \quad (4)$$

$$B = M \cdot A$$

where $$A = \begin{bmatrix} A(k, 0) \\ \ldots \\ \ldots \\ A(k, 4) \end{bmatrix}$$

Figure 4:
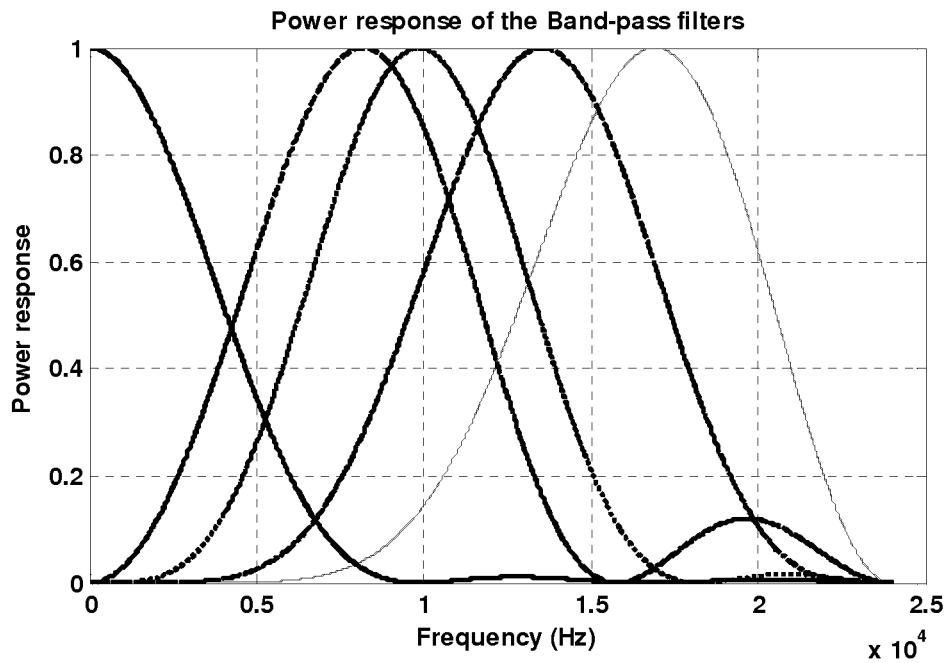
FIG. 4 shows idealized filter response characteristics (power response versus frequency) of bands in a Filterbank 16, the response characteristics being suitable for use in the arrangements of FIGS. 1 and 2.

A common method for calculating the power of an audio signal in a frequency band of interest is to filter the audio signal, and then calculate the autocorrelation of the filtered signal. The 0 lag of the autocorrelation is the band power. If the band filter is a FIR filter, the band power can be equivalently calculated as the dot product of the autocorrelation of the signal and the autocorrelation of the filter impulse response. Because both autocorrelation vectors are symmetrical, the dot product can be performed using one half of the each of the autocorrelation vectors—where the non-zero lag values are summed twice. Each row of the matrix M represents the one sided autocorrelation of a band filter. Non-zero lag values are doubled to effect the necessary double summation. Matrix M has one row for each band. In this example, five bands were found to produce useful results. The choice of the number of bands involves a tradeoff—although a small number of bands reduces complexity, when the number of bands is too small the arrangement may fail to detect narrowbandedness under common signal conditions. Suitable Filterbank 16 band filter power responses are shown in the idealized responses of FIG. 4. The matrix M implements these filters and also includes a scaling such that the "energy per ERB band" is the same from band to band. As is well known, the ERB scale is a psychoacoustic-based frequency mapping. In FIG. 4, the low "bump" at approximately 20 kHz is ripple from the $2^{nd}$ band filter that is centered at approximately 8 kHz in this example.

Because typical audio signals have more bass energy and less energy with rising frequency (similar to a pink noise signal), the first band nearly always has significantly more energy than all the other bands. To compensate for this situation, the band power of the first band preferably is reduced so as to be approximately similar to the others for commonly occurring signals by dropping its power by approximately 10 dB (×0.1). The result is the modified band power B' that may be expressed as:

$$B' = \begin{cases} 0.1 \cdot B[b] & \text{where } b = 0 \\ B[b] & \text{where } b > 0 \end{cases} \quad (5)$$

After reducing band 1, the Spectral Localization device or function 18 may then calculate the scaling factor as the ratio of the second largest and largest band power values, a simple calculation requiring low processing power and memory. The scaling factor may be constrained to be between approximately −7 dB (×0.2) and 0 dB. If the denominator of the ratio is zero, the division result is undefined and so the scaling factor D(k) is set to 1.0.

$$D(k) = \begin{cases} \max\left(\frac{\max(B'')}{\max(B')}, 0.2\right) & \text{where } \max(B') > 0 \\ 1.0 & \text{where } \max(B') = 0 \end{cases} \quad (6)$$

where B"=B' not including max(B').

For typical audio signals that have roughly a pink-noise-shaped spectrum, the scaling factor D(k) is close to 1.0 and for spectrally localized signals is close to 0.2.

Finally, a scaled weighted power measurement $P_D(k)$ may be calculated as the product of the weighted power measure the scaling factor:

$$P_D(k) = D(k) \cdot P(k) \quad (7)$$

The scaled weighted power measure, optionally, may then be smoothed in Smoothing 14.

The calculation in Equation 6 may be further simplified by only considering the first (lowest in frequency) two bands (after reducing band 1). The scaling factor may be calculated as the ratio of the smaller to the larger of the first two band powers. As above, the scaling factor preferably is constrained to a range of between −7 dB and 0 dB. As above, if the denominator of the ratio is zero, the divide result is undefined and so the scaling factor is set to 1.0.

$$D(k) = \begin{cases} \max\left(\frac{\min(B'(0), B'(1))}{\max(B'(0), B'(1))}, 0.2\right) & \text{where } \max(B'(0), B'(1)) > 0 \\ 1.0 & \text{where } \max(B'(0), B'(1)) = 0 \end{cases} \quad (8)$$

In addition to being slightly faster to compute, Equation 8 has been found to have sound quality benefits. One problem with Equation 6 is that during vocal singing, there can be instances of "ess" where not only the scaling factor rises toward 1.0, but the signal power also rises. The net effect is a dramatic increase in the power that can cause the downstream loudness processing to, in the case of dynamics processing, apply more gain reduction to the "ess" than is necessary. De-essing is a common tool of audio mixing but when over used, it can become perceptually annoying. Since Equation 8 only looks at the lower frequency bands, the scaling factor does not rise as quickly during the sibilance "ess" in vocal singing.

Implementation

The invention may be implemented in hardware or software, or a combination of both (e.g., programmable logic arrays). Unless otherwise specified, algorithms and processes included as part of the invention are not inherently related to any particular computer or other apparatus. In particular, various general-purpose machines may be used with programs written in accordance with the teachings herein, or it may be more convenient to construct more specialized apparatus (e.g., integrated circuits) to perform the required method steps. Thus, the invention may be implemented in one or more computer programs executing on one or more programmable computer systems each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such program may be implemented in any desired computer language (including machine, assembly, or high level procedural, logical, or object oriented programming languages) to communicate with a computer system. In any case, the language may be a compiled or interpreted language.

Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

A number of embodiments of the invention have been described. Nevertheless, it will be understood that various modifications may be made without departing from the spirit and scope of the invention. For example, some of the steps described herein may be order independent, and thus can be performed in an order different from that described.

The invention claimed is:

1. A method for adjusting the loudness of an audio signal while reducing changes in its perceived spectral balance, comprising:

applying the audio signal to a dynamically-controllable filter having a high-frequency response characteristic and a low-frequency response characteristic, receiving dynamically-changing information as to the desired gain in each of a plurality of frequency bands of the audio signal that, when applied to the audio signal, tends to preserve perceived spectral balance as the loudness of the audio signal is varied, the information being in response to the audio signal and a desired loudness, wherein there are three or more frequency bands in juxtaposition with one another including an anchor band generally between the lower end of the frequency range in which the high-frequency response characteristic varies and the upper end of the frequency range in which the low-frequency response characteristic varies, a top band at the upper end of the frequency range in which the filter's response varies, and at least one band between the anchor band and the top band, and dynamically controlling said filter in response to said information, wherein the high-frequency response characteristic is a variable shelf filter response and the low-frequency response characteristic is a variable-slope response that has a boost/attenuation in the logarithmic domain that reduces monotonically below the anchor band, the variable shelf filter response being controlled in response to the desired gain in each of said three or more frequency bands and the variable-slope response being controlled in response to the desired gain in said anchor band.

2. A method according to claim 1 wherein the number of bands in the frequency range that includes the anchor band and the top band is fewer than the number of the human ear's critical bands in that frequency range.

3. A method according to claim 1 wherein the desired gain in each band is obtained by analyzing the input signal over a frequency range wider than that of the respective band.

4. A method according to claim 1 wherein the cutoff frequency of the variable shelf filter response is responsive to the level of the audio signal with respect to a threshold of hearing.

5. A method according to claim 1 wherein said anchor band is about 700 Hz to about 2 kHz.

6. A method according to claim 1 wherein the desired gain in the anchor band is obtained by analyzing the input signal over a frequency range that includes frequencies between 500 Hz and 2 kHz.

7. A computer program, stored on a non-transitory computer-readable medium, for causing a computer to perform the method of claim 1.

8. A non-transitory computer-readable medium storing thereon the computer program performing the method of claim 1.

9. A non-transitory computer-readable medium storing thereon the computer program performing the method of claim 2.

10. A non-transitory computer-readable medium storing thereon the computer program performing the method of claim 3.

11. A non-transitory computer-readable medium storing thereon the computer program performing the method of claim 4.

12. A non-transitory computer-readable medium storing thereon the computer program performing the method of claim 5.

13. A non-transitory computer-readable medium storing thereon the computer program performing the method of claim 6.

* * * * *